US008687415B2

(12) United States Patent
Parkin et al.

(10) Patent No.: US 8,687,415 B2
(45) Date of Patent: Apr. 1, 2014

(54) DOMAIN WALL MOTION IN PERPENDICULARLY MAGNETIZED WIRES HAVING ARTIFICIAL ANTIFERROMAGNETICALLY COUPLED MULTILAYERS WITH ENGINEERED INTERFACES

(75) Inventors: Stuart Stephen Papworth Parkin, San Jose, CA (US); Luc Thomas, San Jose, CA (US); See-Hun Yang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 13/543,090

(22) Filed: Jul. 6, 2012

(65) Prior Publication Data

US 2014/0009994 A1 Jan. 9, 2014

(51) Int. Cl.
*G11C 11/14* (2006.01)
(52) U.S. Cl.
USPC .............................. 365/171; 365/173; 365/158
(58) Field of Classification Search
USPC ................................... 365/171, 173, 158, 80
See application file for complete search history.

(56) References Cited

U.S. PATENT DOCUMENTS

| 6,834,005 | B1 | 12/2004 | Parkin |
| 6,898,132 | B2 | 5/2005 | Parkin |
| 6,920,062 | B2 | 7/2005 | Parkin |
| 7,551,469 | B1 | 6/2009 | Parkin |
| 7,965,468 | B2 | 6/2011 | Rhie |
| 8,488,375 | B2 * | 7/2013 | Saida et al. ................... 365/171 |
| 2008/0137405 | A1 | 6/2008 | Ohno et al. |
| 2008/0258247 | A1 | 10/2008 | Mancoff et al. |
| 2009/0168493 | A1 | 7/2009 | Kim et al. |
| 2009/0303631 | A1 | 12/2009 | Rhie |
| 2010/0061135 | A1 | 3/2010 | Nagasaka et al. |
| 2010/0118583 | A1 | 5/2010 | Hung et al. |
| 2010/0128510 | A1 | 5/2010 | Cowburn |
| 2010/0148288 | A1 | 6/2010 | Johnson |
| 2011/0163402 | A1 | 7/2011 | Fukami et al. |
| 2011/0170342 | A1 | 7/2011 | Dimitrov et al. |

FOREIGN PATENT DOCUMENTS

| EP | 1701357 A1 | 9/2006 |
| WO | 2007063718 A1 | 6/2007 |
| WO | 2010020440 A1 | 2/2010 |

OTHER PUBLICATIONS

Parkin, "Racetrack Memory: a storage class memory based on current controlled magnetic domain wall motion", IEEE 978-1-4244-3527, Feb. 2009, pp. 3-6.
Lau et al., "Magnetic nanostructures for advanced technologies: fabrication, metrology and challenges", Journal of Physics D: Applied Physics, 44, 303001, 2011, pp. 1-43.
Fukami et al., "Stack Structure Dependence of Co/Ni Multilayer for Current-Induced Domain Wall Motion", Applied Physics Express 3, 2010, pp. 113002-1-13002-3.

(Continued)

*Primary Examiner* — David Lam
(74) *Attorney, Agent, or Firm* — Daniel E. Johnson

(57) ABSTRACT

Magnetic wires that include two antiferromagnetically coupled magnetic regions show improved domain wall motion properties, when the domain walls are driven by pulses of electrical current. The magnetic regions preferably include Co, Ni, and Pt and exhibit perpendicular magnetic anisotropy, thereby supporting the propagation of narrow domain walls. The direction of motion of the domain walls can be influenced by the order in which the wire's layers are arranged.

44 Claims, 10 Drawing Sheets

(56) References Cited

OTHER PUBLICATIONS

Fukami et al., "Low-Current Perpendicular Domain Wall Motion Cell for Scalable High-Speed MRAM", Symposium on VLSI Technology Digest of Technical Papers, 2009, pp. 230-231.

Miron et al., "Current-driven spin torque induced by the Rashba effect in a ferromagnetic metal layer", Letters Nature Materials, vol. 9, Mar. 2010, pp. 230-234.

Miron et al., "Fast current-induced domain-wall motion controlled by the Rashba effect", Letters Natural Materials, vol. 10, Jun. 2011, pp. 419-423.

Rodmacq et al., "Influence of thermal annealing on the perpendicular magnetic anisotropy of Pt/Co/AlOx trilayers", Physical Review B 79, 2009, pp. 024423-1-024423-8.

Thomas et al., "Racetrack Memory: a high-performance, low-cost, non-volatile memory based on magnetic domain walls", IEEE 978-1-4577-0505, Feb. 2011, pp. 24.2.1-24.2.4.

Daalderop et al., "Prediction and Confirmation of Perpendicular Magnetic Anisotropy in Co/Ni Multilayers", Physical Review Letters, vol. 68, No. 5, Feb. 3, 1992, pp. 682-685.

Parkin et al., "Magnetic Domain-Wall Racetrack Memory", Science, vol. 320, Apr. 11, 2008, pp. 190-194.

Hayashi et al., "Current-Controlled Magnetic Domain-Wall Nanowire Shift Register", Science, vol. 320, Apr. 11, 2008, pp. 209-211.

Weller et al., "Orbital magnetic moments of Co in multilayers with perpendicular magnetic anisotropy", Physical Review, 1994, vol. 49, No. 18, pp. 12888-12896.

Wilhelm et al., "Interface magnetism in 3d/5d multilayers probed by X-ray magnetic circular dichroism", Phys. Stat. Sol. (a), 2003, vol. 196, No. 1, pp. 33-36.

* cited by examiner

Current direction

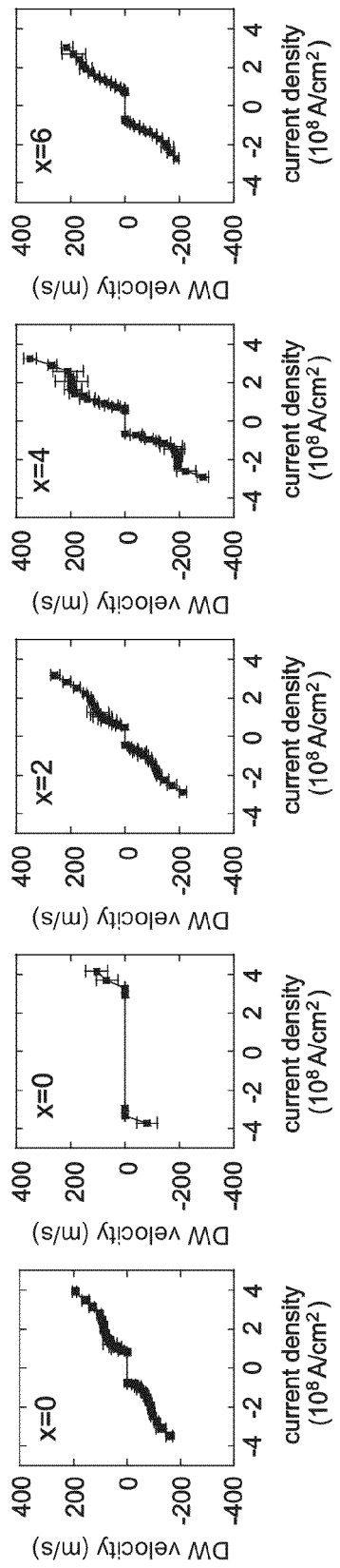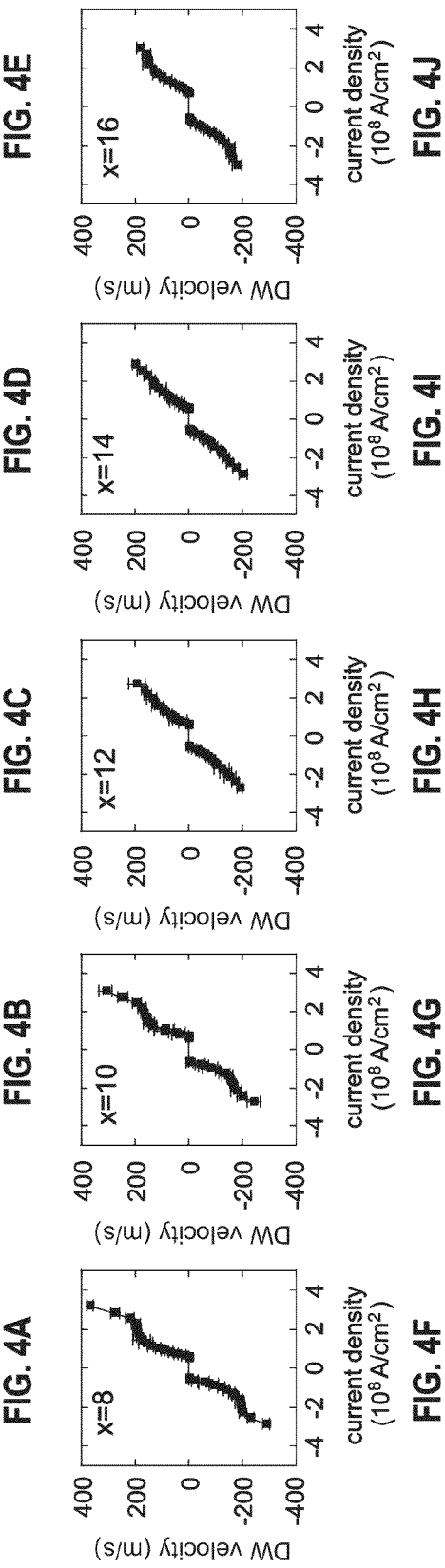

DOMAIN WALL MOTION IN PERPENDICULARLY MAGNETIZED WIRES HAVING ARTIFICIAL ANTIFERROMAGNETICALLY COUPLED MULTILAYERS WITH ENGINEERED INTERFACES

TECHNICAL FIELD

The present invention relates to memory storage systems, and particularly to a memory storage system that uses electrical current to move magnetic domain walls in a magnetic wire formed from an artificially antiferromagnetically coupled magnetic multilayer, with data being stored in the domain walls or their associated domains.

BACKGROUND

Racetrack memory is a memory-storage device in which data are stored in magnetic nanowires in the form of magnetic domain walls that separate magnetic regions magnetized in opposite directions (see, for example, U.S. Pat. Nos. 6,834,005, 6,920,062, and 7,551,469 to Parkin). A key principle underlying this memory is the controlled motion of a series of such domain walls backwards and forwards along the nanowires (also known as racetracks) using nanosecond long pulses of current applied along the nanowire. Devices to inject domain walls and to detect domain walls are integrated into each of the nanowires. The domain walls are moved to the injection and detection devices by means of current pulses of the necessary length and number. The racetracks can be formed from two distinct classes of magnetic materials in which the magnetization of the material is (a) predominantly oriented within the plane and along the length of the nanowire and (b) predominantly oriented perpendicular to the length of and perpendicular to the plane of the nanowire. Materials that form class (a) are typically composed of soft magnetic materials in which the intrinsic magnetocrystalline anisotropy of the material is small compared to the shape magnetic anisotropy derived from magnetostatic energies associated with the cross-sectional shape and size compared to the length of the nanowire. In these materials the domain walls are typically wide: for example, the domain walls in nanowires formed from permalloy, an alloy of Ni and Fe in the approximate atomic composition ratio 80:20, are typically 100-200 nm wide, and these domain walls can be readily deformed. Materials that form class (b) are typically composed of ultrathin magnetic layers in which their interfaces with non-magnetic layers give rise to interfacial magnetic anisotropies that can result in their magnetization preferring to be oriented perpendicular to these interfaces. Typical examples include an ultrathin layer of Co placed adjacent to a Pt layer and multi-layered structures formed from alternating layers of atomically thin Co and Pt layers. Another example are multilayers formed from ultrathin layers of Co and Ni. For such materials the width of the domain walls are smaller, the greater is the perpendicular magnetic anisotropy (PMA) and can be as narrow as 1-10 nm. Thus materials of class (b) are preferred for the fabrication of dense racetrack memories.

In prior art devices the domain walls are shifted to and fro along racetracks by current pulses in which the current is spin-polarized as a result of spin-dependent scattering within the bulk of the magnetic materials from which the racetrack is formed. The transfer of spin angular momentum from the spin polarized current to the domain wall gives rise to a torque on the magnetic moments within the domain wall that results in motion of the domain wall along the nanowire. This phenomenon of spin transfer torque (STT) results in the domain walls being driven in the direction of the flow of spin angular momentum such that spin angular momentum is transferred from the current to the magnetic moments. It is well established that in permalloy the conduction electrons that carry the electrical current are majority spin polarized, i.e., the conduction electrons have their magnetic moments oriented parallel to the direction of the local magnetic moments on the Ni and Fe atoms. This results in magnetic domain walls in permalloy nanowires moving in the direction of the flow of the conduction electrons, i.e., opposite to the direction of the electrical current. The velocity of the domain walls depends on the magnitude of the electrical current and for current densities of $\sim 10^8$ A/cm$^2$ in permalloy, the domain walls move with velocities of $\sim 100$ m/sec.

Domain walls can be pinned by defects arising from roughness of the edges or surfaces of the nanowires. In permalloy and other materials in class (a) the interaction of the spin polarized current and the domain wall's magnetization is such that very large current densities are required to move domain walls that are pinned by even comparatively small pinning potentials. For example a current density of $\sim 10^8$ A/cm$^2$ can overcome effective pinning fields of just a few Oersted. By contrast the much narrower domain walls in materials of class (b) changes the details of the interaction of spin polarized current and the domain wall's magnetization so that much larger pinning fields can be overcome compared to the domain walls in materials of class (a) for otherwise the same current density. Since nanowires will inevitably have rough edges and surfaces this is a significant advantage of materials in class (b).

Finally, a third advantage of materials of class (b) is that racetracks with PMA can be made magnetically very thin, just a few atomic layers thick, and yet the domain walls can be stable against thermal fluctuations because of the very large PMA. Since the magnetic nanowires are very thin, and therefore contain proportionally less magnetic moment, domain walls can be injected into the nanowires using injection devices that use spin torque transfer from currents injected across tunnel barriers into the racetracks. For materials in class (a) the racetracks of prior art devices have to be formed from much thicker magnetic layers in order to stabilize domain walls with a vortex domain structure that can be moved with currents. In thinner racetracks formed from materials of class (a) the domain walls have a transverse wall structure that requires much higher current densities to move them.

SUMMARY

Preferred embodiments and implementations of the current invention are directed to moving domain walls with currents at high efficiency in wires with perpendicular magnetic anisotropy that allow for narrow domain walls (DWs). The convention adopted herein is that the first layer deposited on the substrate is the "bottom"-most layer, whereas the last deposited layer is the "top"-most layer. Likewise, "above", "below", "under", and "over" are defined with respect to the order in which layers are formed, rather than gravity. The layers of a stack are listed in the order in which they are deposited.

We show that domain walls in artificially antiferromagnetically coupled magnetic stacks formed from a first set of Co layers or Co/Ni/Co trilayers or Co/[Ni/Co]$_N$ (where N indicates the number of bilayers) multilayers artificially antiferromagnetically coupled by means of an antiferromagnetic coupling layer to a second set of Co layers or Co/Ni/Co trilayers or Co/[Ni/Co]$_M$ (where M indicates the number of bilayers) multilayers can be driven by current either along or against the current flow direction by engineering the interfaces at the bottom and top of the magnetic stack or within the magnetic stack itself. The exchange coupling changes its sign as a function of coupling layer thickness, and the entire magnetic moment is reduced when the coupling is negative or antiferromagnetic. In the preferred embodiment disclosed herein, we find that the antiferromagnetic exchange coupling strength between two magnetic regions having perpendicular magnetic anisotropy (PMA) is greater than 1 Tesla, thus reducing the magnetic moment significantly when the Ru exchange coupling layer is, for example, 4-10 angstroms thick.

Furthermore, we show that the mechanism for driving the domain walls strongly depends on the nature of the metallic materials below, above, and within the magnetic stack. When the magnetic stack is grown on Pt, Pd, and Ir, the interface between these metals and the bottom Co layer drives the domain walls in the direction of current flow. When these metals are deposited on top of the magnetic stack, the interface gives rise to a mechanism that drives the domain walls in the opposite direction, i.e., that of the electron flow. The introduction of a thin Pt layer within the stack between a Co and a Ni layer drives the domain walls in the current direction when the Pt is introduced below a Co layer, and in the opposite direction when the Pt layer is introduced above a Co layer. The velocity with which the domain walls are driven by current depends on the total number of Pt/Co and Co/Pt interfaces. In addition to these interface current driven domain wall mechanisms, the intrinsic bulk mechanism that drives the domain walls in Co/Ni multilayers along the electron flow is also operative. The thicker and the larger the number of Co and Ni layers, the more dominant is this mechanism. The interface current DW driving mechanism can drive domain walls at high speed. We show that DW velocities of up to ~430 m/sec at current densities of ~1.5×10$^8$ A/cm$^2$ can be realized in Pt/Co/Ni/Co/Ru/Co/Ni/Co magnetic wires.

One aspect of the invention is a method comprising providing a magnetic wire that acts as a track for the motion of a domain wall. The wire includes an underlayer, a first magnetic region, a coupling layer, a second magnetic region, and an overlayer. The first magnetic region is over, and in contact with, the underlayer and has an easy magnetization direction perpendicular to the interface between the underlayer and the first magnetic region, with the first magnetic region being ferromagnetic and/or ferrimagnetic. The coupling layer is over, and in contact with, the first magnetic region. The second magnetic region is over, and in contact with, the coupling layer, with the second magnetic region being ferromagnetic and/or ferrimagnetic. The first magnetic region and the second magnetic region are antiferromagnetically coupled by the coupling layer. The overlayer is over, and in contact with, the second magnetic region. The underlayer, the first magnetic region, the coupling layer, the second magnetic region, and the overlayer extend along at least a portion of the length of the wire. At least one of the underlayer and the overlayer includes a non-magnetic material selected from the group of elements consisting of Pt, Pd, and Ir. The method further includes applying current to the wire, thereby moving a domain wall along the wire, in which the domain wall extends (i) across the first magnetic region, the coupling layer, and the second magnetic region and (ii) into at least a portion of the underlayer and/or a portion of the overlayer.

Another aspect of the invention is a method that comprises providing a magnetic wire that acts as a track for the motion of a domain wall. The wire includes a first magnetic region that is ferromagnetic and/or ferromagnetic, a coupling layer, and a second magnetic region that is ferromagnetic and/or ferrimagnetic. The coupling layer is over, and in contact with, the first magnetic region. The first magnetic region has an easy magnetization direction perpendicular to the interface between the first magnetic region and the coupling layer. The second magnetic region is over, and in contact with, the coupling layer. The first magnetic region and the second magnetic region are antiferromagnetically coupled by the coupling layer, so that the absolute value of the wire's remanent magnetization is less than 0.50 times the sum of (i) the absolute value of the magnitude of the first magnetic region's magnetization and (ii) the absolute value of the magnitude of the second magnetic region's magnetization. The first magnetic region, the coupling layer, and the second magnetic region extend along at least a portion of the length of the wire. The method further includes applying current to the wire, thereby moving a domain wall along the wire, in which the domain wall extends across the first magnetic region, the coupling layer, and the second magnetic region.

The Co layers preferably have a thickness between 1 and 10 angstroms (and more preferably between 1 and 4.5 angstroms), the Ni layers preferably have a thickness between 1 and 10 angstroms (and more preferably between 4 and 8 angstroms), the layers of non-magnetic material preferably have a thickness between 2 and 50 angstroms (and more preferably between 5 and 15 angstroms), and the coupling layers (ideally 99 atomic percent Ru and/or Os) preferably have a thickness between 4 and 10 angstroms.

BRIEF DESCRIPTION OF THE DRAWINGS

FIG. 2 is directed to the magnetic properties of films with perpendicular magnetic anisotropy (PMA) and a synthetic antiferromangetic structure (SAF), in which: FIGS. 2A-J show the hysteresis loops measured by Kerr magnetometry of blanket films comprised of 20 TaN/15 Pt/3 Co/7 Ni/1.5 Co/x Ru/1.5 Co/7 Ni/1.5 Co/50 TaN (all thicknesses herein are in Å). The Ru coupling layer thickness x is varied between 0 and 16 Å. Note that FIG. 2A shows results for x=0 and a single, 1.5 Å thick, Co layer between the two Ni layers, whereas FIG. 2B shows data for x=0 and a 3.0 Å thick Co layer between the two Ni layers.

FIG. 3 is directed to an experimental method and corresponding results for domain wall velocity measurements, in which:

FIG. 4 is directed to current-driven DW motion in Pt/Co/Ni/Co/Ru/Co/Ni/Co/TaN wires, in which:

FIG. 4A-J show the DW velocity versus current density measured for 5 ns long current pulses on 2 micrometer wide wires patterned from the films whose hysteresis loops are shown in FIG. 2.

FIG. 5 is directed to the effect of the Ru coupling layer of thickness x on the properties of Pt/Co/Ni/Co/Ru/Co/Ni/Co/TaN wires, in which:

FIG. 6 is directed to the current driven DW motion in relation to the compensation of the magnetic moment of antiferromagnetically coupled Pt/Co/Ni/Co/Ru/Co/Ni/Co/TaN wires, in which:

DETAILED DESCRIPTION

Figure 1A:
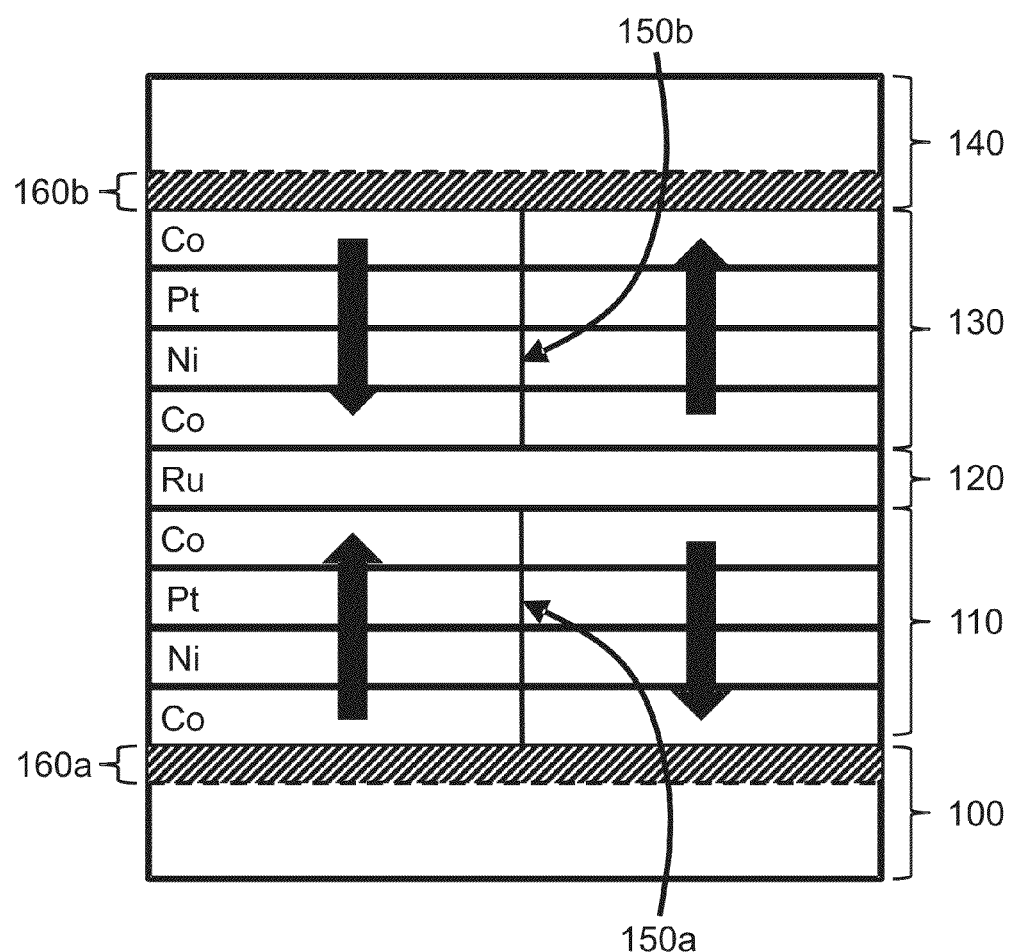
FIGS. 1A and 1B are schematic diagrams of preferred embodiments of the invention.

A preferred embodiment of this invention is shown in FIG. 1A. An underlayer 100 is first deposited on a substrate. Then the layers of a first magnetic region 110 are deposited on the underlayer. An antiferromagnetic coupling layer 120 is deposited on top of the first magnetic region 110 followed by the deposition of the layers of a second magnetic region 130. Finally an overlayer 140 is deposited on top of the second magnetic region 130. The underlayer 100, the first magnetic region 110, the antiferromagnetic coupling layer 120, the second magnetic region 130, and the overlayer 140 form the magnetic wire within which magnetic domains are introduced. The two magnetic regions 110, 130 are formed from a series of layers that include ferromagnetic and/or ferrimagnetic layers. The magnetic regions 110, 130 include a sequence of ferromagnetic layers of Co, ferromagnetic layers of Ni, and non-ferromagnetic layers of Pt. The Pt layers are preferably in contact with a Co layer and a Ni layer. As illustrated in FIG. 1A, the first and second magnetic regions 110, 130 are each formed from layers of Co, Ni, Pt, and Co deposited successively one after the other.

Two magnetic domains ("left" and "right" domains) are illustrated in FIG. 1A each of which includes contributions from the two magnetic regions 110, 130. These contributions to the magnetization (as well as the net magnetization) are oriented perpendicular to the interfaces between the Co and Ni layers. The direction of the magnetization of these contributions is indicated by the black arrows (which point either "up" or "down"). The two magnetic domains are separated by a domain wall, whose contributions from the first and second magnetic regions 110, 130 are denoted by 150a, 150b, respectively.

Figure 1B:
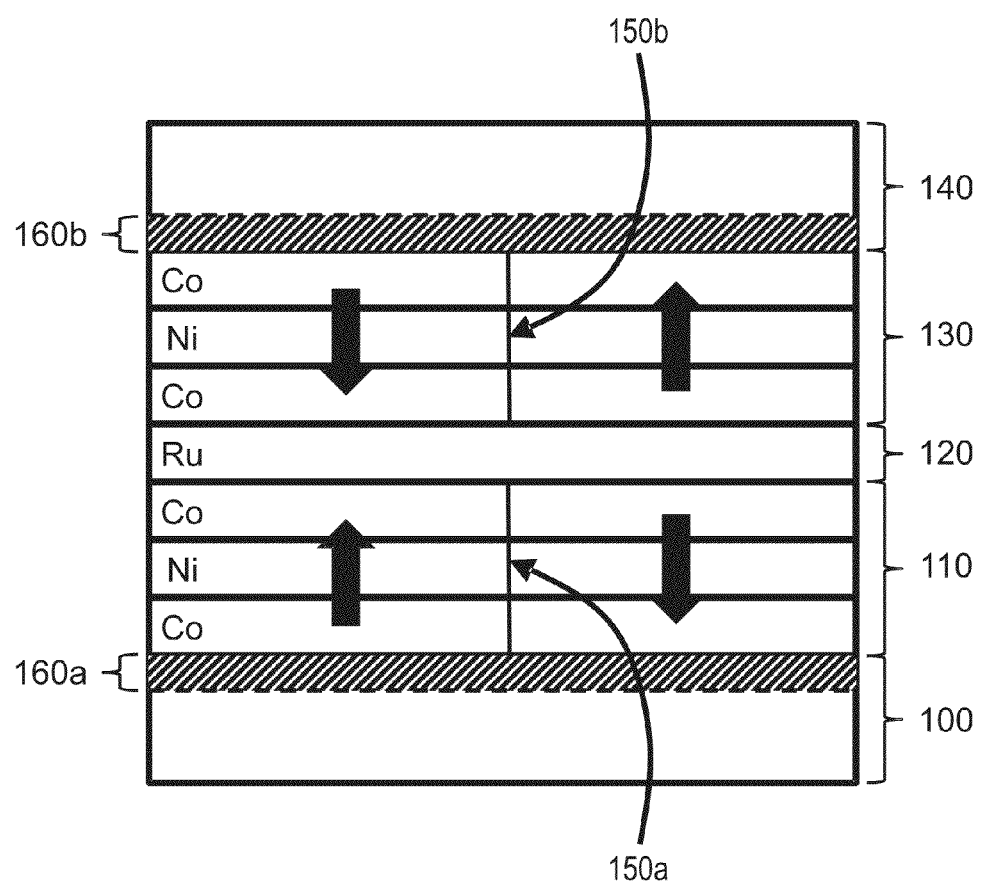

In the left domain of FIG. 1A the magnetization is oriented up in the first magnetic region 110 and down in the second magnetic region 130. The direction of the magnetization in the first magnetic region 110 is thus antiparallel to that of the magnetization in the second magnetic region 130 in view of the antiferromagnetic coupling provided by the antiferromagnetic coupling layer 120 (formed from Ru and having a thickness chosen to give antiferromagnetic coupling). In the right domain of FIG. 1A the magnetization in the first magnetic region 110 is oriented antiparallel to that of the left domain in the first magnetic region. Similarly, in the right domain of FIG. 1A, the magnetization in the second magnetic region 130 is oriented antiparallel to that of the left domain in the second magnetic region. Also shown in FIG. 1A is a region 160a in the underlayer 100 that exhibits a magnetic moment induced by its proximity to the adjacent Co layer. Similarly region 160b in the overlayer becomes magnetic due to its proximity to an adjacent Co layer. Another preferred embodiment is shown in FIG. 1B, in which each of the magnetic regions 110, 130 now includes a Co/Ni/Co trilayer. The domain walls and/or their corresponding domains in FIGS. 1A and 1B represent data (information) that may be written into, and/or read out of, the wires using one or more devices integrated into the wire.

Blanket films with perpendicular magnetic anisotropy (PMA) were deposited by magnetron sputtering on Si wafers coated with 25 nm of $SiO_2$ and 10 nm of $Al_2O_3$ for electrical isolation purposes. The typical structure of the synthetic antiferromangetic structure (SAF) stacks is as follows: 20 TaN/15 Pt/3 Co/7 Ni/1.5 Co/x Ru/1.5 Co/7 Ni/1.5 Co/50 TaN (all thicknesses herein are in Å). In the preferred films herein, the Co and Ni layers have an fcc structure and are oriented in the (111) direction. The Ru coupling layer thickness x was varied between 0 and 16 Å. Kerr hysteresis loops measured with the magnetic field applied perpendicular to the plane of the films (FIG. 2) reveal that all samples have strong PMA.

Figures 2A, 2B, 2C, 2D, 2E, 2F, 2G, 2H, 2I, 2J:
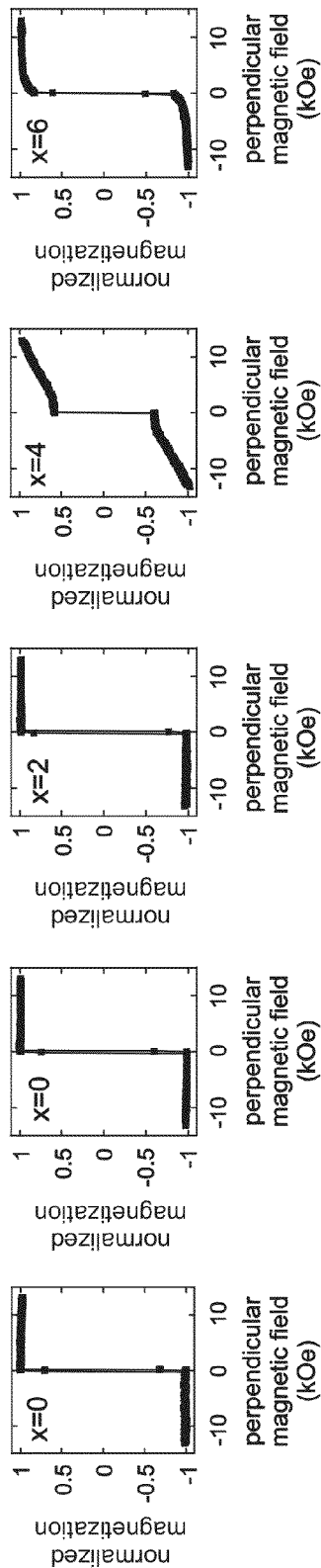

Clear evidence of antiferromagnetic (AF) coupling is observed for x between 4 and 10 Å, as evidenced by the reduction of the magnetization at remanence. We find that the AF coupling is weaker for x=6 (FIG. 2E) than for x=4 (FIG. 2D) and 8 (FIG. 2F). Note that when x=0, the two 1.5 Å thick Co layers in the middle of the stack form a single 3 Å thick layer (FIG. 2B). For completeness, we also show the case in which x=0 and the middle Co layer is only 1.5 Å thick (FIG. 2A).

Figure 3A:
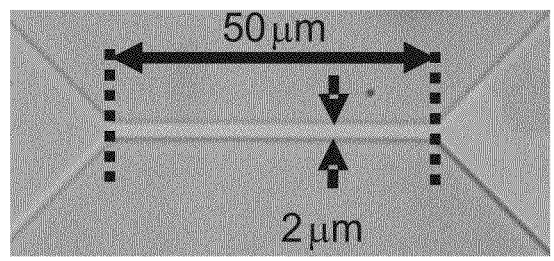
FIG. 3A shows an optical microscopy image of a typical device including a 50 micrometer long, 2 micrometer wide wire connected on each end to wider regions used as bond pads for electrical connections.

Current-driven DW motion was studied using 2 micrometer wide devices formed by UV photolithography and Ar ion milling. The optical microscopy image of a typical device is shown in FIG. 3A. The wire in the central portion of FIG. 3A, where DW motion was imaged, is 50 μm long. This wire is connected at both ends to wider regions that are used as bond pads for electrical connections. In most cases, we find that the PMA is significantly reduced at the wire bonds, such that DWs are nucleated near the bonds and can propagate in the wire under an external field. Once a single DW is injected in the wire, the field is reduced to zero and DW motion is studied by applying a series of current pulses of length $t_P$ to the device.

Figure 3B:
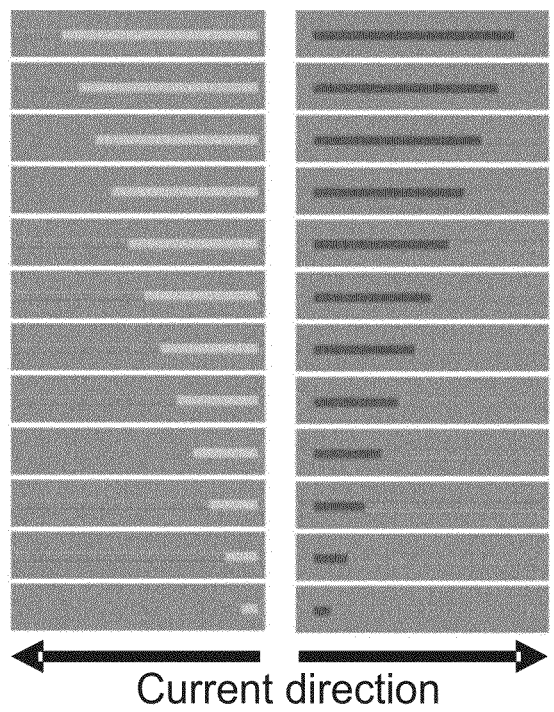
FIG. 3B presents Kerr microscopy images showing the position of a domain wall (DW) in response to series of current pulses. Images are saved at regular intervals chosen such that the DW moves by a measurable amount. The two sequences of images shown in this figure are obtained for two opposite current polarities in a 2 micrometer wide wire made out of 20 TaN/15 Pt/3 Co/7 Ni/1.5 Co/8 Ru/1.5 Co/7 Ni/1.5 Co/50 TaN. Note that the contrast (white or black) is determined by the magnetization direction of the domain which expands as a result of the motion of the DW.
Figure 3C:
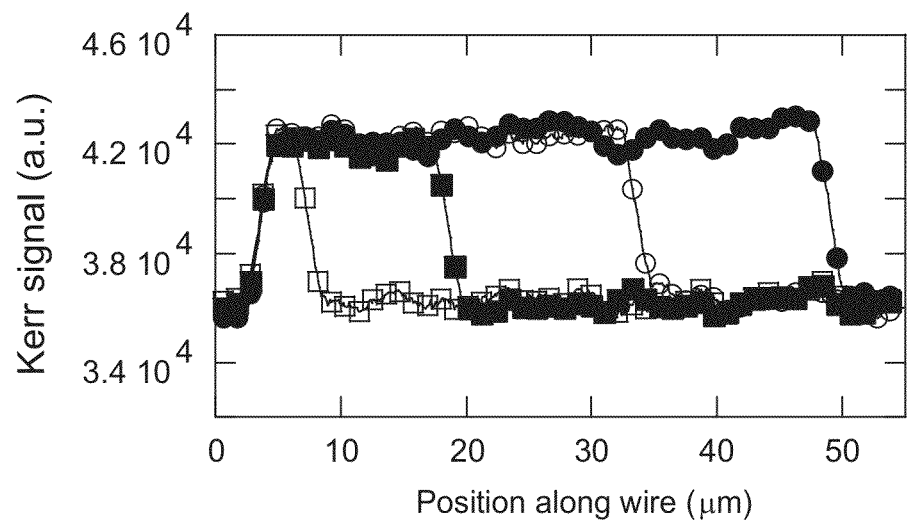
FIG. 3C presents line scans along the wire showing the variation of the Kerr contrast for different positions of the DW. The DW position is measured from these line scans.
Figure 3D:
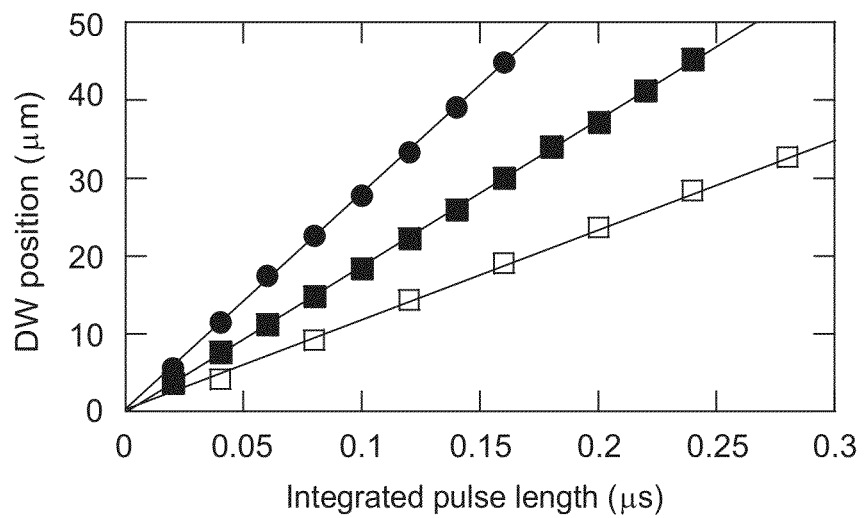
FIG. 3D shows DW position versus integrated current pulse length $t_{CP}$ for current pulses of various amplitudes. Solid lines show linear fits whose slopes are used to determine the velocity of the DW.

Kerr microscopy in differential mode is used to monitor the position of the DW in response to series of current pulses. Images are saved at regular intervals chosen such that the DW moves by a measurable amount between these stored images. Examples of two sequences of images for two different current polarities are shown in FIG. 3B for a 2 μm wide wire made out of 20 TaN/15 Pt/3 Co/7 Ni/1.5 Co/8 Ru/1.5 Co/7 Ni/1.5 Co/50 TaN (once again, all thicknesses are in Å). The current pulses used here were 5 ns long, and the associated currents had a density of ±1.8 $10^8$ A/cm². Note that the contrast (white or black) is determined by the net magnetization direction of the domain that expands as a result of the motion of the DW. The DW position is determined from the images by automated analysis of the Kerr contrast along the wire (FIG. 3C); the profiles shown in this figure are exemplary and are taken for a current density of +1.8 $10^8$ A/cm² and various values of $t_{CP}$, which is the product of $t_P$ and the number of pulses applied to the device. The DW velocity is then determined by assuming that the DW moves only during the current pulses. We use a linear fit of the DW position versus the integrated current pulse length $t_{CP}$ (FIG. 3D). FIG. 3D shows results for 5 ns long current pulses with current densities of 1.0, 1.8 and 2.8 $10^8$ A/cm² (in which increasing current density corresponds to an increased slope in the figure). In some cases, the DW may get pinned by a local defect for some amount of time before it moves again. In these cases, we only fit the portions of the curve in which the position depends linearly on $t_{CP}$. The standard deviation of the differential velocity values calculated for all the points of the DW position vs. $t_{CP}$ curves is used to determine the error bars for the velocity measurement.

FIGS. 4A-J show the DW velocity as a function of the current density J for all ten samples whose hysteresis loops are shown in FIG. 2. In all cases, DWs move in response to current pulses when the current density exceeds a threshold value $J_C$. The DW motion direction depends on the polarity of the current, which is observed when the DW motion is driven by spin transfer torque (STT) from the spin-polarized current. However, these results show DWs moving in the direction of the current flow, indicating that STT is not the sole contribution to the current-driven DW dynamics, and in fact is overwhelmed by another effect. The Pt/Co interface has been determined to be responsible for this anomalous behavior, which is related to the magnetic moment induced in the Pt layer by the adjacent Co layer. The induced moment is largely parallel to that of the Co layer; however, a significant component of the induced moment may be parallel to the interface because of the Dzyaloshinskii-Moriya interaction at the Pt/Co interface.

FIGS. 4A-J highlight the role of the SAF structure on the current-driven DW dynamics. By comparing FIG. 2 and FIG. 4, it becomes clear that the DW velocity is correlated with the hysteresis loops. The current-driven DW velocity is enhanced when the two magnetic layers are AF coupled, i.e., when x=4 Å (FIG. 4D), x=8 Å (FIG. 4F) and x=10 Å (FIG. 4G). Without an interstitial Ru coupling layer (x=0), the DW dynamics is strongly dependent on the thickness of middle Co layer. When this layer is 3 Å thick (FIG. 4B) rather than 1.5 Å thick (FIG. 4A), $J_C$ increases from 0.8 to 3.3 $10^8$ A/cm². Remarkably, one needs only to insert 2 Å of Ru between the two Co layers to reduce $J_C$ down to ~0.5 $10^8$ A/cm² (FIG. 4C) even though the two Co layers are strongly ferromagnetically coupled for this Ru thickness.

Figure 5A:
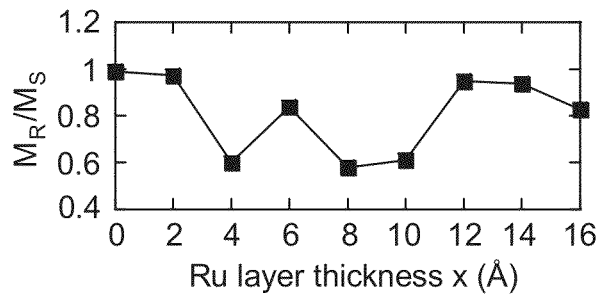
FIG. 5A shows the remanent to saturation magnetization ratio $M_R/M_S$ for blanket films comprised of 20 TaN/15 Pt/3 Co/7 Ni/1.5 Co/x Ru/1.5 Co/7 Ni/1.5 Co/50 TaN as a function of the Ru coupling layer thickness x (the data point for x=0 corresponds to the device without Ru and a single 1.5 Å thick Co layer, as described above in connection with FIG. 2).
Figure 5B:
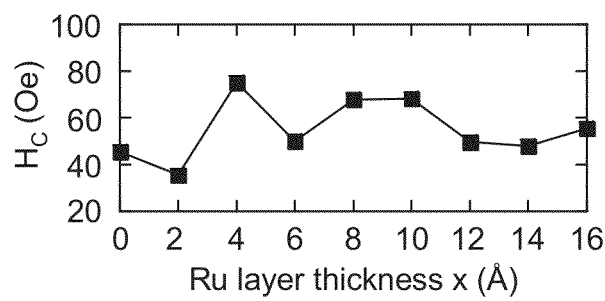
FIG. 5B shows the coercive field $H_C$ of the blanket films as a function of the Ru coupling layer thickness x.
Figure 5C:
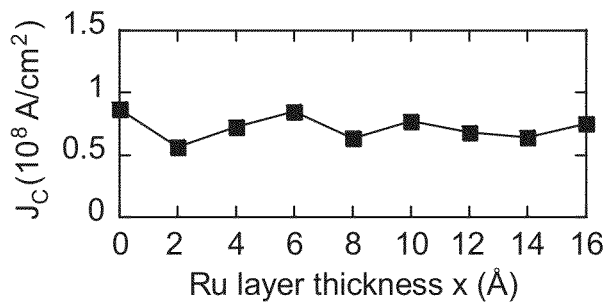
FIG. 5C shows the critical current density $J_C$ of the devices as a function of the Ru coupling layer thickness x measured for 5 ns long current pulses.
Figure 5D:
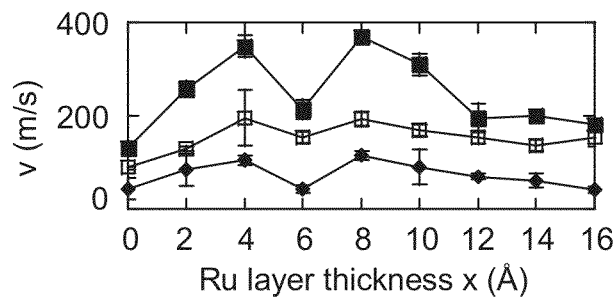
FIG. 5D shows the DW velocity for 5 ns long current pulses and for three different current densities as a function of the Ru coupling layer thickness x. Solid squares, open squares and solid diamonds show data for 3, 2 and 1 $10^8$ A/cm$^2$, respectively.
Figure 5E:
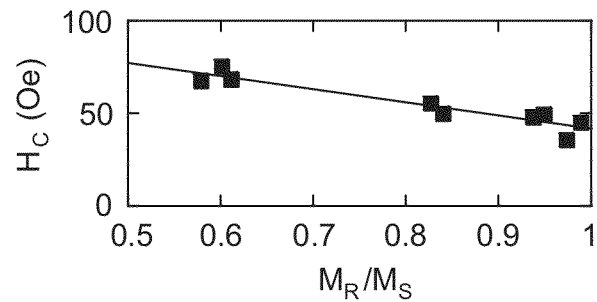
FIGS. 5E-G show the same data as in FIGS. 5B-D plotted as a function of the remanent to saturation magnetization ratio $M_R/M_S$. Solid lines in FIG. 5E and FIG. 5G show linear fits to the data.
Figure 5F:
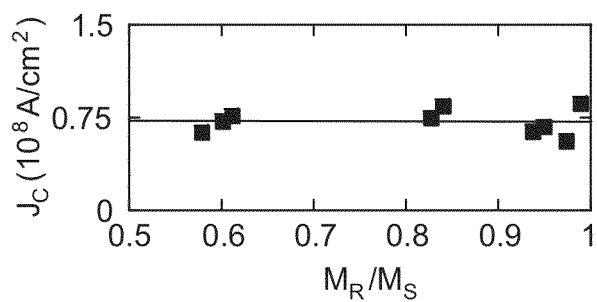
Figure 5G:
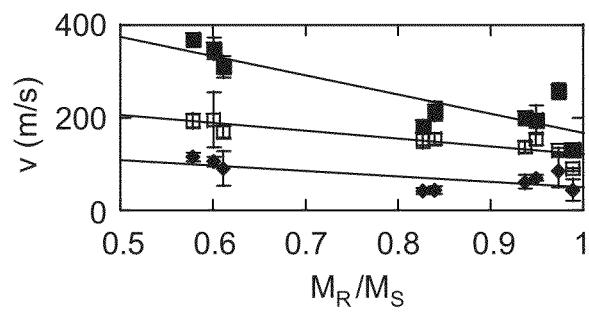
Figure 6A:
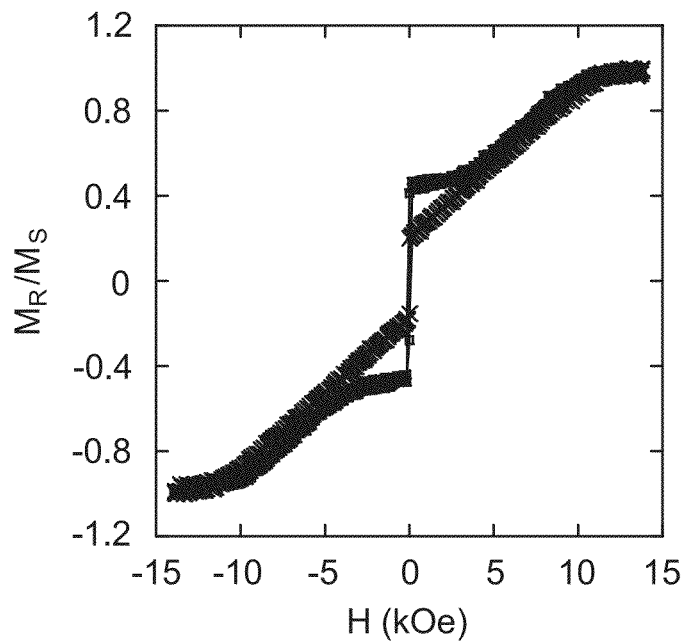
FIG. 6A presents hysteresis loops of blanket films including two Co/Ni/Co multilayers which are separated by a 8 Å thick Ru coupling layer. The films are made of 20 TaN/15 Pt/w Co/7 Ni/x Co/8 Ru/y Co/7 Ni/z Co/50 TaN. Solid symbols and crosses show data for w=1.5, x=1.5, y=1.5, z=1.5 and w=1.5, x=1.5, y=1.5, z=3, respectively.
Figure 6B:
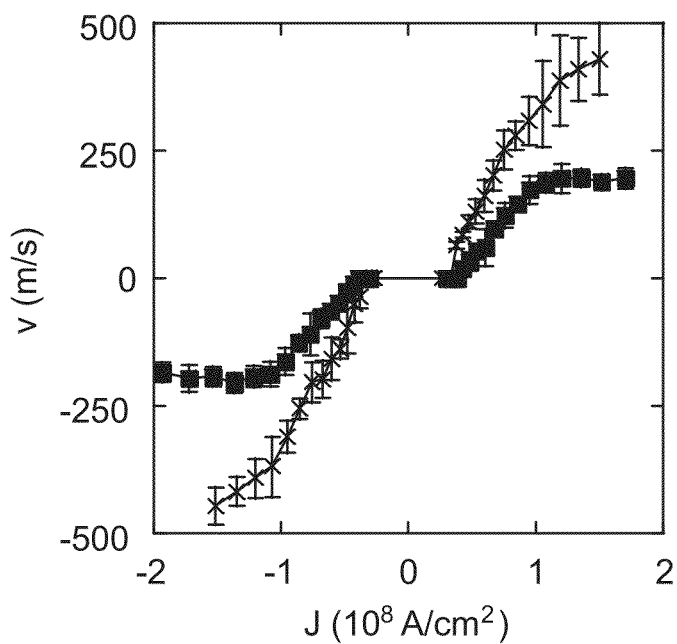
FIG. 6B shows the DW velocity vs. current density for 5 ns long current pulses for 2 devices made out of the films described above in connection with FIG. 6A.
Figure 6C:
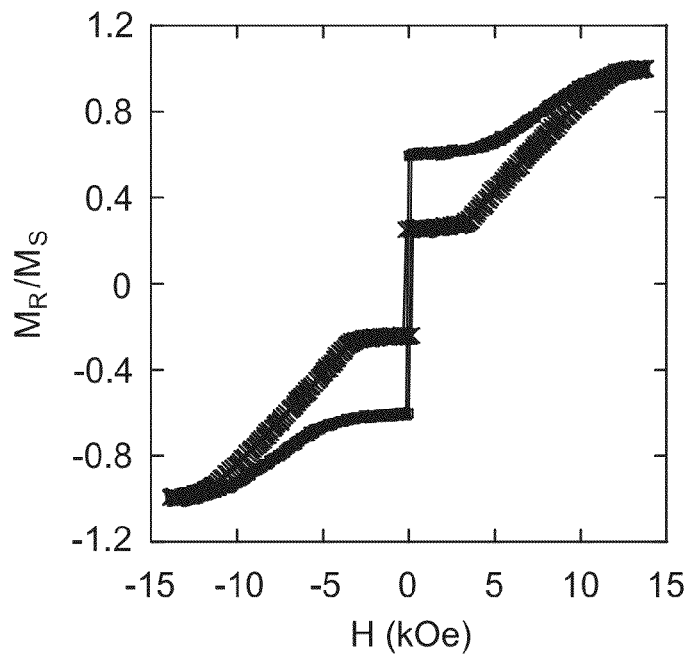
FIG. 6C shows the hysteresis loops of blanket films including the layers described above in connection with FIG. 6A with w=3, x=1.5, y=1.5, z=1.5 (solid symbols) and w=3, x=1.5, y=3, z=1.5 (crosses).
Figure 6D:
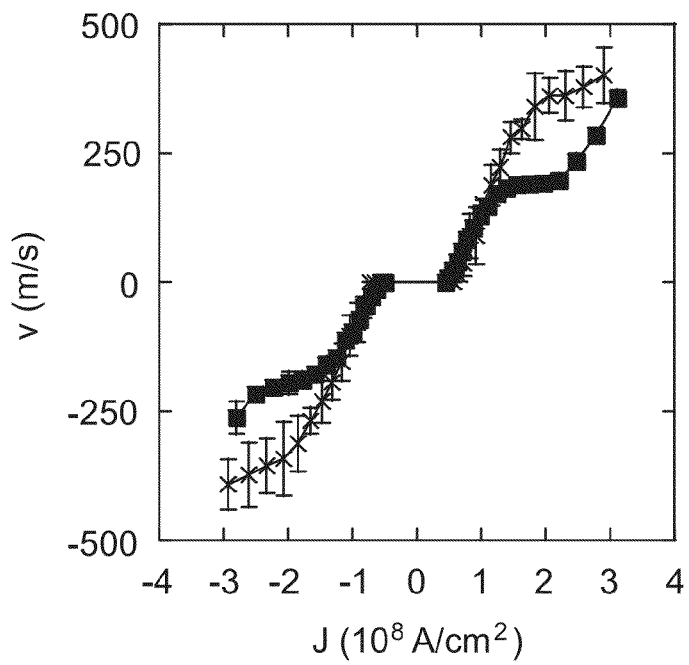
FIG. 6D shows the DW velocity vs. current density for 5 ns long current pulses for 2 devices made out of the films described above in connection with FIG. 6C.

To analyze the correlations between DW dynamics and AF coupling in more detail, several properties of the devices are shown in FIGS. 5A-D as a function of the Ru coupling layer thickness x. These figures show the ratio of remanent to saturation magnetization $M_R/M_S$ (FIG. 5A; note that the saturation magnetization corresponds to the sum of the contributions from the two magnetic regions in the wire), the coercive field of the blanket films $H_C$ (FIG. 5B), the critical current density for DW motion $J_C$ for 5 ns long current pulses (FIG. 5C) and the current-driven DW velocity v for current densities of 1, 2 and 3 $10^8$ A/cm² (FIG. 5D). Note that the point at x=0 corresponds to the sample with a 1.5 Å thick middle Co layer. FIGS. 5E-G show the same quantities as in FIGS. 5B-D as a function of $M_R/M_S$. As already discussed above, the onset of AF coupling for x=4, 6 and 8 is evidenced by a strong reduction of $M_R/M_S$. $H_C$ increases accordingly (FIG. 5E), as expected since the SAF devices are less sensitive to the external field. Interestingly, $J_C$ is independent on x within experimental uncertainty (FIG. 5F), contrary to the current-driven DW velocity which is strongly dependent on x (FIG. 5G). As shown in FIG. 5G, the velocity varies linearly with $M_R/M_S$, at a rate which increases for increasing current densities. The velocity at 3.0 $10^8$ A/cm² is close to 400 m/s for the SAF device, more than twice the value of ferromagnetically-coupled layers. This indicates that significant improvement is achieved when $M_R/M_S$ is less than, for example, 0.75. It is worth noting that an enhanced current-driven DW velocity for the SAF structures is observed despite fairly strong DW pinning. The DW propagation field is larger than 40 Oe for these devices.

To confirm that the increased current-driven DW velocity is due to the SAF structure and not to the insertion of the Ru coupling layer, we have adjusted the thickness of the Co layers to modify the compensation of the SAF structure (FIG. 6). The devices are made out of 20 TaN/15 Pt/w Co/7 Ni/x Co/8 Ru/y Co/7 Ni/z Co/50 TaN. FIGS. 6A and 6B show data for w=1.5, x=1.5, y=1.5, z=1.5 (solid symbols) and w=1.5, x=1.5, y=1.5, z=3 (crosses). FIGS. 6C and 6D show data for w=3, x=1.5, y=1.5, z=1.5 (solid symbols) and w=3, x=1.5, y=3, z=1.5 (crosses). Because of the different thicknesses w of the bottom-most Co layer adjacent to the Pt underlayer, the range of current densities that can be used for DW motion is much smaller in the first case (FIG. 6B) than in the second (FIG. 6D). This is because the current-induced nucleation occurs for current densities larger than a nucleation threshold, which depends on the PMA of the samples, with the PMA being strongly dependent on the thickness of the Co layer adjacent to the Pt underlayer. For both sets of data shown in FIG. 6, the DW velocity is significantly increased when the compensation of the SAF structure is improved. For the devices shown in FIG. 6B, this increase is observed even for low current densities. At $10^8$ A/cm², the DW velocity increases by a factor of 2 (from ~170 to 340 m/s) when $M_R/M_S$ is reduced from 0.45 to 0.2. At 1.5 $10^8$ A/cm² the DW velocity reaches 430 m/s. These data show that the properties of current driven domain wall motion improve as $M_R/M_S$ is reduced, for example, to 0.25 or even 0.10.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method, comprising:
providing a magnetic wire that acts as a track for the motion of a domain wall, the wire including:
an underlayer;
a first magnetic region over, and in contact with, the underlayer and having an easy magnetization direction perpendicular to the interface between the underlayer and the first magnetic region, wherein the first magnetic region is ferromagnetic and/or ferrimagnetic;
a coupling layer over, and in contact with, the first magnetic region; and
a second magnetic region over, and in contact with, the coupling layer, wherein the second magnetic region is ferromagnetic and/or ferrimagnetic, and wherein the first magnetic region and the second magnetic region are antiferromagnetically coupled by the coupling layer; and
an overlayer over, and in contact with, the second magnetic region;
wherein (i) the underlayer, the first magnetic region, the coupling layer, the second magnetic region, and the overlayer extend along at least a portion of the length of the wire, and (ii) at least one of the underlayer and the overlayer includes a non-magnetic material (NMM) selected from the group of elements consisting of Pt, Pd, and Ir; and
applying current to the wire, thereby moving a domain wall along the wire, wherein the domain wall extends (i) across the first magnetic region, the coupling layer, and the second magnetic region and (ii) into at least a portion of the underlayer and/or a portion of the overlayer.

2. The method of claim 1, wherein the first magnetic region includes a layer that is at least 20 atomic percent Co.

3. The method of claim 1, wherein the second magnetic region includes a layer that is at least 20 atomic percent Co.

4. The method of claim 1, wherein the first magnetic region includes a layer that is at least 20 atomic percent Ni.

5. The method of claim 1, wherein the second magnetic region includes a layer that is at least 20 atomic percent Ni.

6. The method of claim 1, wherein the first magnetic region and/or the second magnetic region includes both (i) a layer that is at least 20 atomic percent Co and (ii) a layer that is at least 20 atomic percent Ni.

7. The method of claim 1, wherein the first magnetic region, the second magnetic region, and the layer that includes the non-magnetic material are all fcc and (111) oriented.

8. The method of claim 1, wherein the first magnetic region and/or the second magnetic region includes at least one trilayer selected from the group consisting of Co/Pt/Ni and Ni/Pt/Co, wherein (i) each Ni layer in said at least one trilayer is ferromagnetic and includes at least 20 atomic percent Ni, (ii) each Co layer in said at least one trilayer is ferromagnetic and includes at least 20 atomic percent Co, and (iii) each Pt layer in said at least one trilayer includes at least 70 atomic percent Pt.

9. The method of claim 8, wherein each Ni layer in said at least one trilayer is fcc and (111) oriented.

10. The method of claim 8, wherein each Ni layer in said at least one trilayer has a thickness between 1 and 10 angstroms.

11. The method of claim 8, wherein each Ni layer in said at least one trilayer has a thickness between 4 and 8 angstroms.

12. The method of claim 1, wherein the first and/or second magnetic region includes at least one Co/Ni/Co trilayer, in which each Co layer in said at least one trilayer is at least 20 atomic percent Co, and each Ni layer in said at least one trilayer is at least 20 atomic percent Ni.

13. The method of claim 1, wherein the first and/or second magnetic region includes at least one Co/Ni/Pt/Co multi-layer, in which each Co layer in said at least one multi-layer is at least 20 atomic percent Co, each Ni layer in said at least one multi-layer is at least 20 atomic percent Ni, and each Pt layer in said at least one multi-layer is at least 70 atomic percent Pt.

14. The method of claim 1, wherein each of the first and second magnetic regions includes at least one trilayer selected from the group consisting of Co/Pt/Ni and Ni/Pt/Co, wherein (i) each Ni layer in said at least one trilayer is ferromagnetic and includes at least 20 atomic percent Ni, (ii) each Co layer in said at least one trilayer is ferromagnetic and includes at least 20 atomic percent Co, and (iii) each Pt layer in said at least one trilayer includes at least 70 atomic percent Pt.

15. The method of claim 1, wherein the coupling layer includes Ru and is in contact with (i) a Pt layer in the first magnetic region and/or (ii) a Pt layer in the second magnetic region.

16. The method of claim 1, wherein the coupling layer includes at least one of Ru and Os.

17. The method of claim 16, wherein Ru and Os together constitute at least 99 atomic percent of the coupling layer.

18. The method of claim 1, wherein the coupling layer includes Ru and is between 4 and 10 angstroms thick.

19. The method of claim 1, wherein the coupling layer includes Os and is between 4 and 10 angstroms thick.

20. The method of claim 1, wherein the coupling layer includes Ru and is contact with (i) a Co layer in the first magnetic region and (ii) a Co layer in the second magnetic region.

21. The method of claim 1, wherein each Co layer in the wire is fcc and (111) oriented.

22. The method of claim 1, wherein each Co layer in the wire has a thickness between 1 and 10 angstroms.

23. The method of claim 1, wherein each Co layer in the wire has a thickness between 1 and 4.5 angstroms.

24. The method of claim 1, wherein the underlayer or the overlayer that includes a NMM has a thickness between 2 and 50 angstroms.

25. The method of claim 1, wherein the underlayer or the overlayer that includes a NMM has a thickness between 5 and 15 angstroms.

26. The method of claim 1, wherein the underlayer or the overlayer has a magnetic moment that is induced by its proximity to a Co layer.

27. The method of claim 26, wherein a portion of the induced moment is parallel to the interface.

28. The method of claim 26, wherein a portion of the induced moment is perpendicular to the orientation of the Co moment in the proximal Co layer.

29. The method of claim 1, comprising applying current to the wire, thereby moving a plurality of domain walls along the wire.

30. The method of claim 1, wherein the domain wall moves in the direction of the applied current, the number of NMM/Co interfaces in at least one of the first and second regions being greater than the number of Co/NMM interfaces in said at least one of the regions.

31. The method of claim 1, wherein the domain wall moves in the direction opposite to that of the applied current, the number of Co/NMM interfaces in at least one of the first and second regions being greater than the number of NMM/Co interfaces in said at least one of the regions.

32. A method, comprising:
providing a magnetic wire that acts as a track for the motion of a domain wall, the wire including:
a first magnetic region that is ferromagnetic and/or ferrimagnetic;
a coupling layer over, and in contact with, the first magnetic region, the first magnetic region having an easy magnetization direction perpendicular to the interface between the first magnetic region and the coupling layer; and
a second magnetic region over, and in contact with, the coupling layer, wherein the second magnetic region is ferromagnetic and/or ferrimagnetic, and wherein the first magnetic region and the second magnetic region are antiferromagnetically coupled by the coupling layer, so that the absolute value of the wire's remanent magnetization is less than 0.50 times the sum of (i) the absolute value of the magnitude of the first magnetic region's magnetization and (ii) the absolute value of the magnitude of the second magnetic region's magnetization; and
wherein the first magnetic region, the coupling layer, and the second magnetic region extend along at least a portion of the length of the wire; and
applying current to the wire, thereby moving a domain wall along the wire, wherein the domain wall extends across the first magnetic region, the coupling layer, and the second magnetic region.

33. The method of claim 32, wherein the absolute value of the wire's remanent magnetization is less than 0.25 times the sum.

34. The method of claim 32, wherein the wherein the absolute value of the wire's remanent magnetization is less than 0.10 times the sum.

35. The method of claim 32, wherein:
the wire includes an underlayer that includes an element selected from the group consisting of Pt, Pd, and Ir, the first magnetic region being over, and in contact with, the underlayer; and
the domain wall extends into at least a portion of the underlayer.

36. The method of claim 32, wherein:
the wire includes an overlayer that includes an element selected from the group consisting of Pt, Pd, and Ir, the overlayer being over, and in contact with, the second magnetic region; and
the domain wall extends into at least a portion of the overlayer.

37. The method of claim 32, wherein the first magnetic region and/or the second magnetic region includes both (i) a layer that is at least 20 atomic percent Co and (ii) a layer that is at least 20 atomic percent Ni.

38. The method of claim 32, wherein the first magnetic region and the second magnetic region are both fcc and (111) oriented.

39. The method of claim 32, wherein the first magnetic region and/or the second magnetic region includes at least one trilayer selected from the group consisting of Co/Pt/Ni and Ni/Pt/Co, wherein (i) each Ni layer in said at least one trilayer is ferromagnetic and includes at least 20 atomic percent Ni, (ii) each Co layer in said at least one trilayer is ferromagnetic and includes at least 20 atomic percent Co, and (iii) each Pt layer in said at least one trilayer includes at least 70 atomic percent Pt.

40. The method of claim 32, wherein the coupling layer includes Ru and is in contact with (i) a Pt layer in the first magnetic region and/or (ii) a Pt layer in the second magnetic region.

41. The method of claim 32, wherein the coupling layer includes at least one of Ru and Os.

42. The method of claim 32, comprising applying current to the wire, thereby moving a plurality of domain walls along the wire.

43. The method of claim 32, wherein the domain wall moves in the direction of the applied current, the number of non-magnetic material (NMM)/Co interfaces in at least one of the first and second regions being greater than the number of Co/NMM interfaces in said at least one of the regions.

44. The method of claim 32, wherein the domain wall moves in the direction opposite to that of the applied current, the number of Co/NMM (non-magnetic material) interfaces in at least one of the first and second regions being greater than the number of NMM/Co interfaces in said at least one of the regions.

* * * * *